US012772826B2

(12) United States Patent
Na et al.

(10) Patent No.: US 12,772,826 B2
(45) Date of Patent: Oct. 20, 2026

(54) SEMICONDUCTOR DEVICES

(71) Applicant: Samsung Electronics Co., Ltd., Suwon-si (KR)

(72) Inventors: Sangcheol Na, Suwon-si (KR); Jungho Do, Suwon-si (KR); Kyoungwoo Lee, Suwon-si (KR); Gukhee Kim, Suwon-si (KR); Minchan Gwak, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 409 days.

(21) Appl. No.: 18/582,859

(22) Filed: Feb. 21, 2024

(65) Prior Publication Data

US 2024/0395713 A1 Nov. 28, 2024

(30) Foreign Application Priority Data

May 25, 2023 (KR) ........................ 10-2023-0067526

(51) Int. Cl.

| | |
|---|---|
| ***H10W 20/41*** | (2026.01) |
| ***H10D 30/43*** | (2025.01) |
| ***H10D 30/67*** | (2025.01) |
| ***H10D 62/10*** | (2025.01) |

(52) U.S. Cl.

CPC .......... *H10W 20/427* (2026.01); *H10D 30/43* (2025.01); *H10D 30/6735* (2025.01); *H10D 30/6757* (2025.01); *H10D 62/121* (2025.01)

(58) Field of Classification Search

CPC . H10W 20/427; H10W 20/20; H10W 70/635; H10W 70/611; H10W 70/65; H10W 20/42; H10W 20/435; H10D 30/43; H10D 30/6735; H10D 30/6757; H10D 62/121; H10D 89/10

See application file for complete search history.

(56) References Cited

U.S. PATENT DOCUMENTS

| | | | | |
|---|---|---|---|---|
| 9,768,119 | B2 | 9/2017 | Yu et al. | |
| 10,510,774 | B2 | 12/2019 | Debacker et al. | |
| 10,622,307 | B2 | 4/2020 | Kim | |
| 10,886,224 | B2 | 1/2021 | Gerousis et al. | |
| 11,055,469 | B2 | 7/2021 | Peng et al. | |
| 11,233,044 | B2 | 1/2022 | Wang et al. | |
| 11,798,933 | B2 * | 10/2023 | Kim ...................... | G06F 30/394 |
| 11,842,964 | B2 * | 12/2023 | Do .......................... | G06F 30/39 |

(Continued)

*Primary Examiner* — Allison Bernstein

(74) *Attorney, Agent, or Firm* — Wolf, Greenfield & Sacks, P.C.

(57) ABSTRACT

A semiconductor device includes first power lines extending on a substrate in a first direction and spaced apart from each other in a second direction, back side power structures on a lower surface of the substrate, standard cells each including an active pattern, a gate pattern intersecting the active pattern, and contacts, power tap cells between at least some of the standard cells and each including vertical power vias, and second power lines electrically connecting at least some of the first power lines to each other. A first portion of the second power lines may extend onto the power tap cells and a second portion of the second power lines that is different from the first portion may extend onto the standard cells. The power tap cells may be arranged in every three or more rows of the standard cells in the second direction in a zigzag pattern.

20 Claims, 12 Drawing Sheets

(56) References Cited

U.S. PATENT DOCUMENTS

| | | | | |
|---|---|---|---|---|
| 11,961,802 | B2 * | 4/2024 | Liebmann | H10D 30/031 |
| 2021/0082815 | A1 | 3/2021 | Doornbos | |
| 2021/0098361 | A1 | 4/2021 | Doornbos et al. | |
| 2022/0122970 | A1 | 4/2022 | Do et al. | |
| 2022/0181258 | A1 | 6/2022 | Liebmann et al. | |
| 2022/0199527 | A1 | 6/2022 | Pelloie | |
| 2022/0208757 | A1 | 6/2022 | Do et al. | |
| 2022/0223523 | A1 | 7/2022 | Lee et al. | |
| 2023/0378027 | A1 * | 11/2023 | Choi | H10W 20/0234 |
| 2024/0258200 | A1 * | 8/2024 | Lin | H10W 20/20 |

* cited by examiner

SEMICONDUCTOR DEVICES

CROSS-REFERENCE TO RELATED APPLICATION(S)

This application claims benefit of priority to Korean Patent Application No. 10-2023-0067526 filed on May 25, 2023 in the Korean Intellectual Property Office, the disclosure of which is incorporated herein by reference in its entirety.

BACKGROUND

The present inventive concepts relate to semiconductor devices.

As demands for high performance, high speed, and/or multifunctionality of a semiconductor device increase, a degree of integration of the semiconductor device is increasing. According to the trend for a high degree of integration in semiconductor devices, semiconductor devices having a back side power delivery network (BSPDN) structure in which power rails are disposed on a rear surface of a wafer are being developed.

SUMMARY

Aspects of the present inventive concepts provide semiconductor devices having an improved degree of integration and which are easier to manufacture due to an improved degree of design freedom.

According to aspects of the present inventive concepts, a semiconductor device includes first power lines that extend on a substrate in a first direction, are spaced apart from each other in a second direction intersecting the first direction, and are on power rail tracks; back side power structures on a lower surface of the substrate; standard cells arranged in the first and second directions, wherein each of the standard cells comprises an active pattern that extends in the first direction, a gate pattern that intersects the active pattern and extends in the second direction, and contacts on opposing sides of the gate pattern, respectively; power tap cells between at least some of the standard cells, wherein each of the power tap cells comprises vertical power vias that are electrically connected to ones of the first power lines and ones of the back side power structures, respectively; and second power lines that extend in the second direction on the first power lines, wherein at least one of the second power lines electrically connects at least one of the first power lines that is on at least one of the power tap cells to one or more of the first power lines that are spaced apart from the at least one of the power tap cells in the second direction, wherein the power rail tracks define rows in the second direction, wherein the power tap cells are arranged in every three or more of the rows and are staggered with each other in the second direction, and wherein ones of the first power lines overlap respective ones of the vertical power vias.

According to aspects of the present inventive concepts, a semiconductor device includes first power lines that extend on a substrate in a first direction and are spaced apart from each other in a second direction intersecting the first direction; back side power structures on a lower surface of the substrate; standard cells arranged in the first and second directions, wherein each of the standard cells comprises an active pattern that extends in the first direction, a gate pattern that intersects the active pattern and extends in the second direction, and contacts on opposing sides of the gate pattern, respectively; power tap cells between at least some of the standard cells, wherein each of the power tap cells comprises vertical power vias that are electrically connected to ones of the first power lines and ones of the back side power structures, respectively; and second power lines that extend in the second direction on the first power lines and electrically connect at least some of the first power lines to each other, wherein a first portion of the second power lines extends onto the power tap cells and a second portion of the second power lines that is different from the first portion extends onto the standard cells, and wherein the power tap cells are arranged in every three or more rows of the standard cells in the second direction and are arranged in a zigzag pattern in the second direction.

According to aspects of the present inventive concepts, a semiconductor device includes first power lines that extend on a substrate in a first direction and are spaced apart from each other in a second direction intersecting the first direction; back side power structures on a lower surface of the substrate; standard cells arranged in the first and second directions, wherein each of the standard cells comprises an active pattern that extends in the first direction, a gate pattern that intersects the active pattern and extends in the second direction, and contacts on opposing sides of the gate pattern, respectively; and power tap cells between at least some of the standard cells, wherein each of the power tap cells comprises vertical power vias that are electrically connected to ones of the first power lines and ones of the back side power structures, respectively, wherein the standard cells are arranged in first to seventh rows in the second direction, wherein the power tap cells comprise first power tap cells in the first row, second power tap cells in the fourth row, and third power tap cells in the seventh row, and wherein the first power tap cells and the second power tap cells are offset from each other in the second direction, and the first power tap cells and the third power tap cells are aligned in the second direction.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
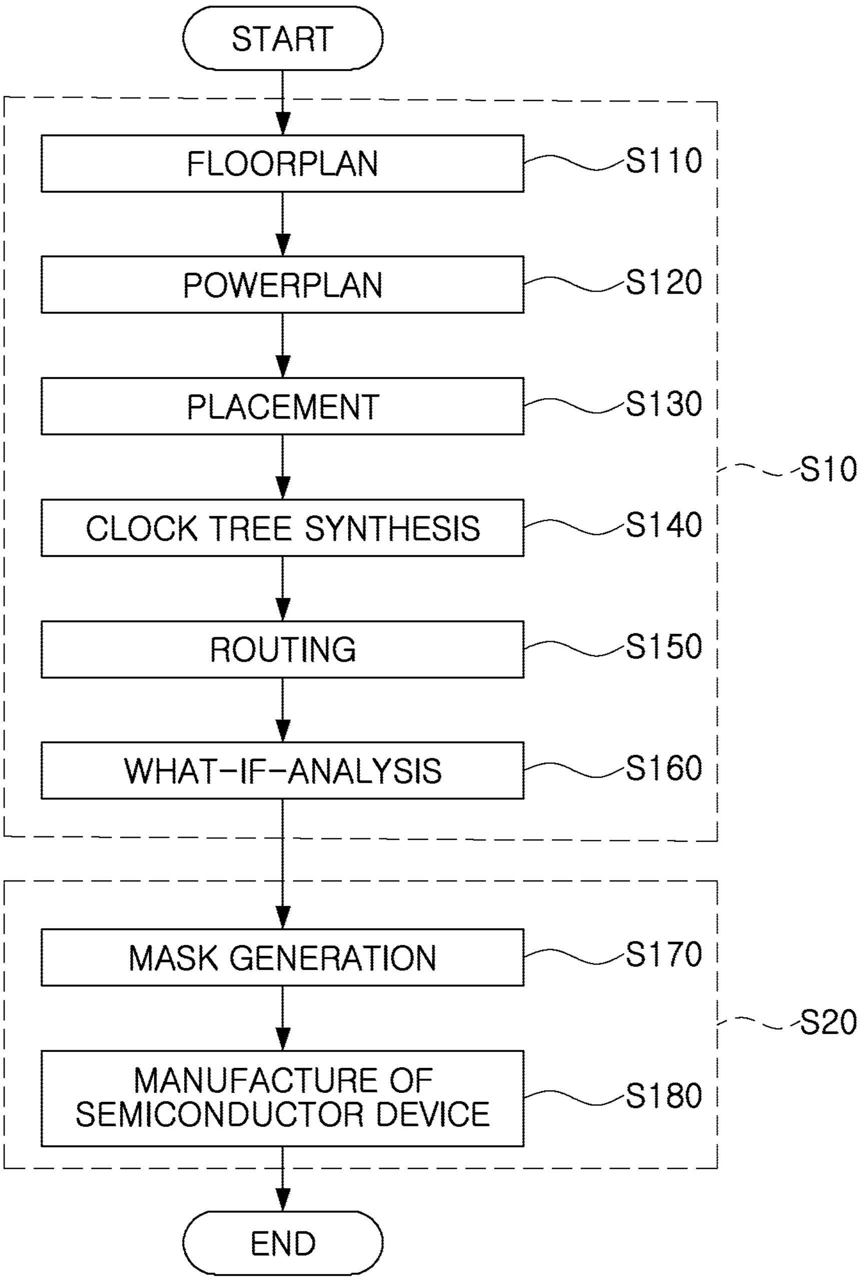
FIG. 1 is a flowchart illustrating a method of designing and manufacturing a semiconductor device according to example embodiments.

Hereinafter, embodiments of the present inventive concepts will be described with reference to the accompanying drawings. Hereinafter, it can be understood that terms such as ‘on,’ ‘upper,’ ‘upper portion,’ ‘upper surface,’ ‘below,’ ‘lower,’ ‘lower portion,’ ‘lower surface,’ ‘side surface,’ and the like may be denoted by reference numerals and refer to the drawings, except where otherwise indicated.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

FIG. 1 is a flowchart illustrating a method of designing and manufacturing a semiconductor device according to example embodiments.

Referring to FIG. 1, a method of designing and manufacturing a semiconductor device may include a design operation S10 of the semiconductor device and a manufacturing process operation S20 of the semiconductor device. The design operation S10 may be an operation of designing a layout for a circuit, and may be performed using a tool for designing the circuit. The tool may be a program including a plurality of instructions executed by a processor. Therefore, the design operation S10 may be a computer implemented operation for designing the circuit. The manufacturing process operation S20 may be an operation of manufacturing the semiconductor device according to the designed layout, based on the designed layout, and may be performed in a semiconductor process module.

The design operation S10 may include a floorplan operation S110, a powerplan operation S120, a placement operation S130, a clock tree synthesis (CTS) operation S140, a routing operation S150, and a what-if-analysis operation S160.

The floorplan operation S110 may be an operation of physically designing a schematic circuit logically designed by cutting and moving the same. In the floorplan operation S110, a memory or circuit functional block may be disposed. In this operation, for example, circuit functional blocks to be arranged adjacently may be identified, and spaces for the circuit functional blocks may be allocated in consideration of a usable space, required performance, or the like. For example, the floorplan operation S110 may include an operation of creating a site-row and an operation of forming a routing track in the created site-row. The site-row may be a frame for arranging standard cells stored in a cell library according to prescribed design rules. The routing track may provide a virtual line on which power lines are formed later.

The powerplan operation S120 may be an operation of arranging patterns of interconnections connecting local power, e.g., driving voltage or ground, to the arranged circuit functional blocks. For example, power lines or patterns of the power lines connecting power or ground may be generated such that power may be evenly supplied to the entire chip in a net form. The patterns may constitute power rails, and in this operation, the patterns may be generated in a net form through various rules.

The placement operation S130 may be an operation of arranging patterns of elements constituting the circuit functional block, and may include an operation of arranging power tap cells and standard cells. In example embodiments, the power tap cells may be disposed first before disposing of the standard cells. Therefore, a degree of arrangement freedom of the standard cells disposed in a region between the power tap cells may be adjusted according to arrangement of the power tap cells. A power tap cell may be a cell in which an electrical connection passage is disposed to connect an interconnection (e.g., the power line) above a semiconductor substrate and an interconnection (e.g., a back side power distribution network) below the semiconductor substrate. A standard cell may be a cell including an operable semiconductor element, a unit circuit implemented with the semiconductor element, or the like. In some embodiments, an empty region may occur even after the power tap cells and the standard cells are disposed, and the empty region may be filled by filler cells. Unlike the power tap cells and the standard cells, the filler cell may be a cell forming a dummy region. By this operation, a shape or a size of a pattern for constituting a transistor and interconnections, which will be actually formed on a silicon substrate, may be defined. For example, to actually form an inverter circuit on the silicon substrate, layout patterns such as a PMOS, an NMOS, an N-WELL, a gate electrode, and interconnections to be disposed thereon may be appropriately disposed.

The CTS operation S140 may be an operation of generating patterns of signal lines of a central clock related to a response time for determining performance of the semiconductor device.

The routing operation S150 may be an operation of generating an upper interconnection structure or a routing structure including upper interconnection lines connecting arranged standard cells. In particular, a power distribution network (PDN) may be implemented in this operation. The upper interconnection lines may electrically connect the standard cells to each other, or may be connected to power or ground.

The virtual analysis operation S160 (also referred to as the what-if-analysis operation) may be an operation of verifying and correcting a generated layout. Items to be verified may include design rule check (DRC) verifying that a layout is properly aligned with a design rule, electronical rule check (ERC) verifying that the layout is properly internally electrically disconnected, layout vs schematic (LVS) checking that the layout matches a gate-level net list, or the like.

The manufacturing process operation S20 may include a mask generation operation S170 and a semiconductor device manufacturing operation S180.

The mask generation operation S170 may include an operation of generating mask data for forming various patterns on a plurality of layers by performing optical proximity correction (OPC) or the like on layout data generated in the design operation S10, and an operation of manufacturing a mask using the mask data. The optical proximity correction may be for correcting a distortion phenomenon that may occur in a photolithography process. The mask may be fabricated by depicting layout patterns using a chromium thin film applied on a glass substrate or a quartz substrate.

In the semiconductor device manufacturing operation S180, various types of exposure and etching processes may be repeatedly performed. Through these processes, shapes of patterns configured in layout design may be sequentially formed on the silicon substrate. Specifically, various semiconductor processes may be performed on the semiconductor substrate such as a wafer using a plurality of masks, to form a semiconductor device in which an integrated circuit is implemented. The semiconductor processes may include a deposition process, an etching process, an ion process, a cleaning process, and the like. Also, the semiconductor processes may include a packaging process of mounting the semiconductor device on a PCB and sealing the same with a sealing material, or may include a test process for the semiconductor device or a package thereof.

Figure 2:
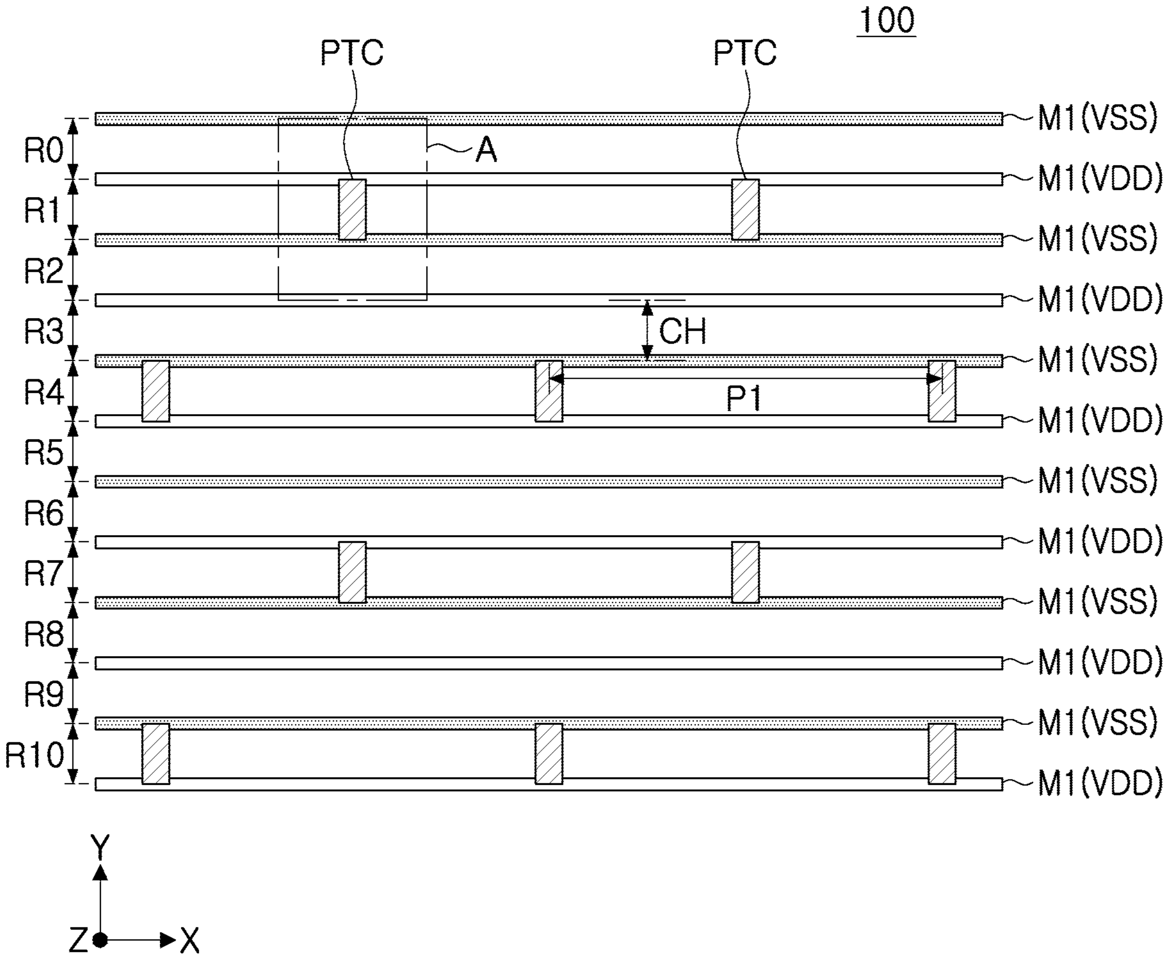
FIG. 2 is a schematic layout diagram of a semiconductor device according to example embodiments.

FIG. 2 is a schematic layout diagram of a semiconductor device according to example embodiments.

Referring to FIG. 2, a semiconductor device 100 may include first power lines M1(VDD) and M1(VSS), and power tap cells PTC electrically connected to the first power lines M1(VDD) and M1(VSS).

The first power lines M1(VDD) and M1(VSS) may constitute a power rail, and may be disposed along power rail tracks. Therefore, a plurality of rows R0 to R10 may be defined in the Y-direction by the power rail tracks or the first power lines M1(VDD) and M1(VSS). Standard cells and the power tap cells PTC may be disposed in the rows R0 to R10. The first power lines M1(VDD) and M1(VSS) may extend in a first direction, for example, an X-direction. As used herein, "an element A extends in a first direction" (or similar language) may mean that the element A extends longitudinally in the first direction. The first power lines M1(VDD) and M1(VSS) include first high power lines M1(VDD) supplying a first voltage, and first low power lines M1(VSS) supplying a second voltage, lower than the first voltage. The first high power lines M1(VDD) and the first low power lines M1(VSS) may be spaced apart from each other in a second direction, intersecting the first direction, for example, in the Y-direction, and may be alternately arranged.

The power tap cells PTC may be disposed in only ⅓ of the rows R0 to R10. The power tap cells PTC may be disposed in a first group of rows (R1, R4, R7, and R10), which may be a portion of the rows R0 to R10. The power tap cells PTC may be electrically connected to upper first power lines M1(VDD) and M1(VSS), and may be electrically connected to back side power structures located and constituting a BSPDN. The back side power structures may be disposed to overlap the first power lines M1(VDD) and M1(VSS), for example. For example, the back side power lines (i.e., the back side power structures) may be arranged to overlap the first power lines M1(VDD) and M1(VSS) and have a linear form having a greater width than the first power lines M1(VDD) and M1(VSS), but are not limited thereto. In some embodiments, the back side power structures may overlap the first power lines M1(VDD) and M1(VSS) in a Z-direction (also referred to as a vertical direction). As used herein, "an element A overlaps an element B in a first direction" (or similar language) means that there is at least one line that extends in the first direction and intersects both the elements A and B.

The power tap cells PTC may be spaced apart from each other in the X-direction in each of the first group of rows (R1, R4, R7, and R10). The power tap cells PTC may be arranged every three rows in the Y-direction, and may be arranged to be staggered with each other or in a zigzag pattern. In other words, the power tap cells PTC may be arranged every three rows in the Y-direction, and may be arranged so that the power tap cells PTC in at least one of the rows are offset in the Y-direction with the power tap cells PTC of another one of the rows (e.g., may be staggered with each other). As used herein, "an element A and an element B are offset in a first direction" (or similar language) means that the element A and the element B are not aligned in the first direction. The power tap cells PTC disposed in a first row R1 may be disposed on a straight line with the power tap cells PTC disposed in a seventh row R7 in the Y-direction, respectively, and may be disposed to be offset from the power tap cells PTC disposed in fourth and tenth rows R4 and R10. For example, the power taps cell PTC in the first row R1 may be spaced apart in the X-direction from the power tap cells PTC in the fourth and tenth rows R4 and R10 and may be offset in the Y-direction from (e.g., may not be aligned in the Y-direction with) the power tap cells PTC in the fourth and tenth rows R4 and R10. The power tap cells PTC may be arranged in a form, for example, such that one power tap cell PTC is surrounded with six power tap cells PTC spaced apart therefrom, but are not limited thereto. In example embodiments, the power tap cells PTC may be arranged in various forms in a range of being arranged every three or more rows. As used herein, "the power tap cells PTC may be arranged every three or more rows" (or similar language) means that the power tap cells PTC may be arranged every $n^{th}$ row where n is equal to or greater than three. That is, the power tap cells PTC may be arranged every three rows, every four rows, every five rows, etc. A pitch P1 of the power tap cells PTC in each of the first group of rows (R1, R4, R7, and R10) may be, for example, in a range of 20 contacted-poly-pitch (CPP) to 60 CPP, but is not limited thereto. For example, 1 CPP may correspond to a pitch of gate patterns PC (see FIG. 3). The "pitch" may refer to a distance between centers of elements, and when widths of the elements are constant, may be equal to a sum of the width of each of the elements and a separation distance of the elements.

The standard cells may be disposed in regions in which the power tap cells PTC are not disposed in the rows R0 to R10. The power tap cells PTC may not be disposed in a second group of rows (R0, R2, R3, R5, R6, R8, and R9), which may be a different portion of the rows R0 to R10. That is, the second group of rows (R0, R2, R3, R5, R6, R8, and R9) may be free of the power tap cells PTC. Since the power tap cells PTC are not disposed in the second group of rows (R0, R2, R3, R5, R6, R8, and R9), the standard cells having various sizes may be disposed around the power tap cells PTC. For example, in the second rows R2 and R3 adjacent in the Y-direction, a degree of freedom in cell placement may be secured in a region corresponding to twice a unit cell height CH. The "unit cell height" may refer to a length of a standard cell in a direction in which the rows R0 to R10 are arranged, for example, in the Y-direction. When the pitch P1 of the power tap cells PTC is, for example, 40 CPP, a degree of freedom in cell arrangement may be secured in the first group of rows (R1, R4, R7, and R10) in a region having a length corresponding to 40 CPP.

Figure 3:
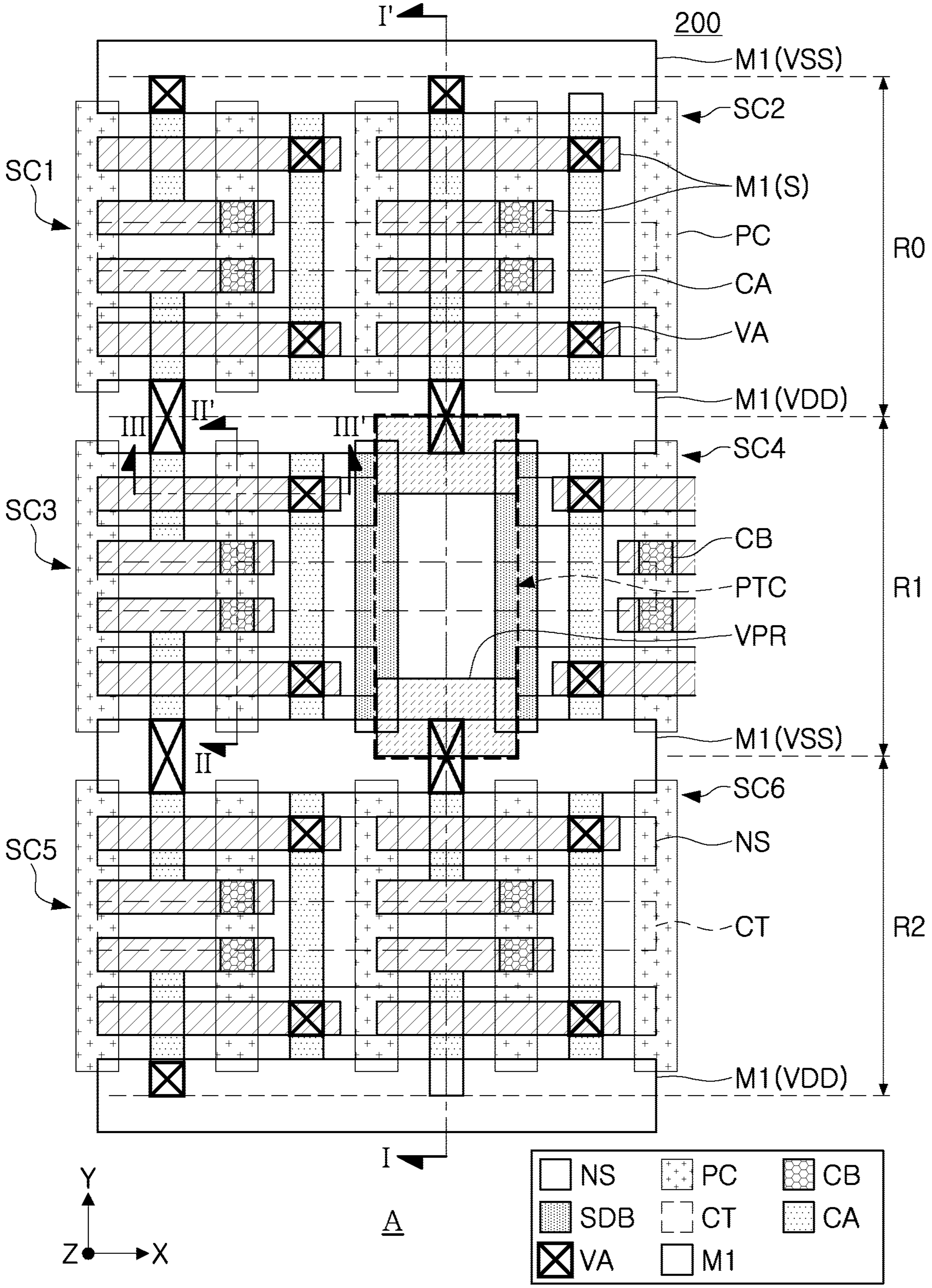
FIGS. 3, 4A, and 4B are layout diagrams of a semiconductor device according to example embodiments.
Figure 4A:
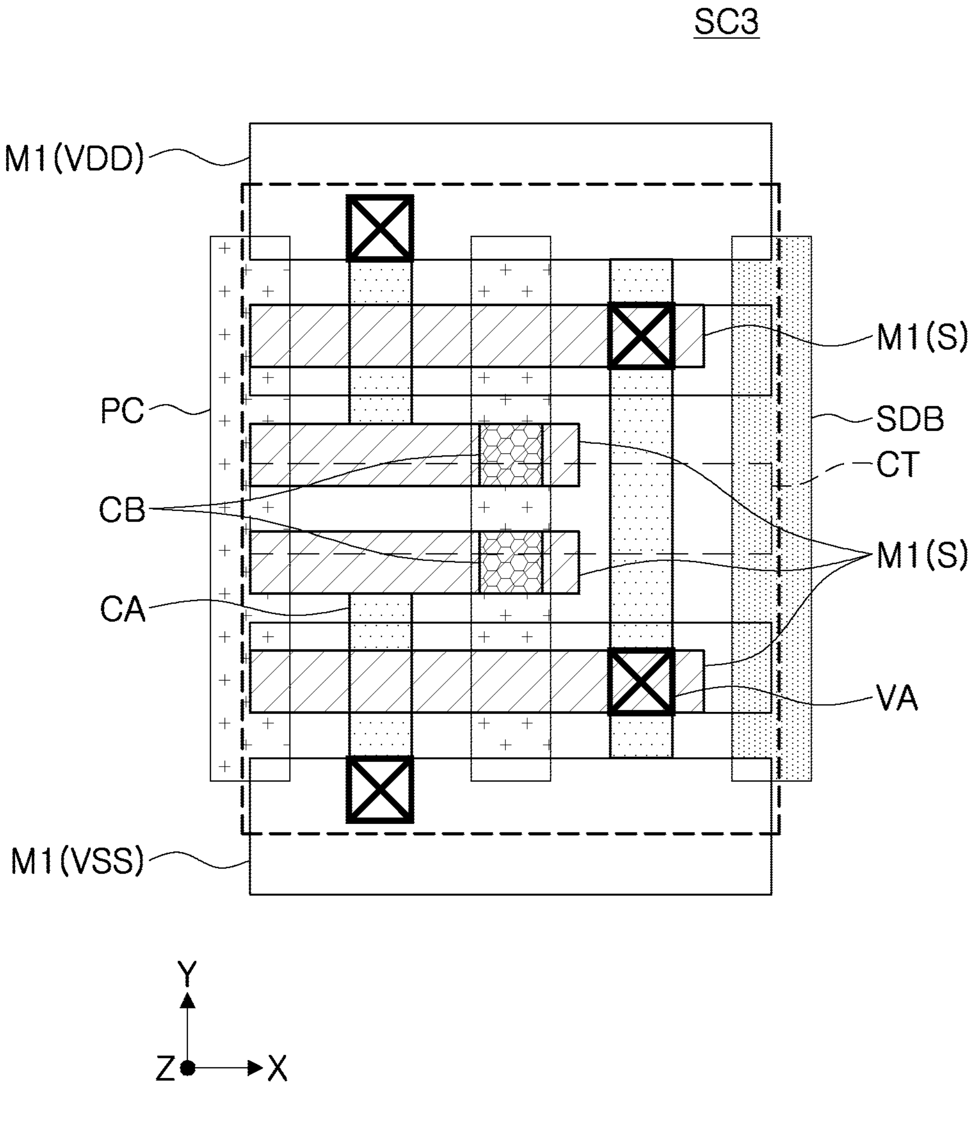
Figure 4B:
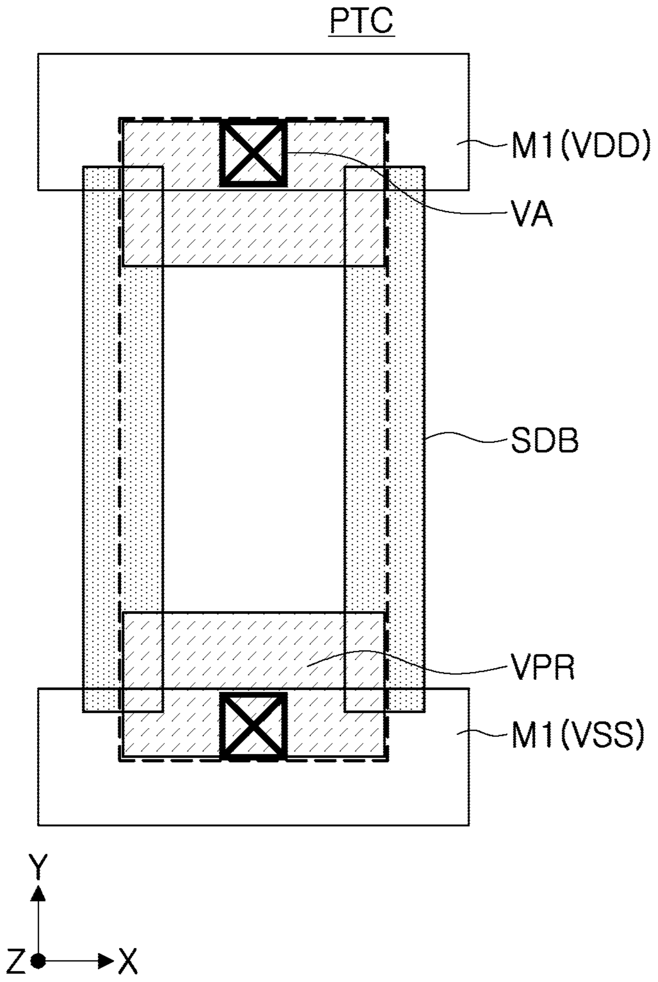

FIGS. 3, 4A, and 4B are layout diagrams of a semiconductor device according to example embodiments. FIG. 3 illustrates a layout of an example embodiment for portion 'A' of FIG. 2, and FIGS. 4A and 4B respectively enlarge and illustrate a third standard cell SC3 and a power tap cell PTC of FIG. 3.

Referring to FIGS. 3, 4A, and 4B, a semiconductor device 200 may include first power lines M1(VDD) and M1(VSS), first to sixth standard cells SC1 to SC6, and a power tap cell PTC. The first to sixth standard cells SC1 to SC6 and the power tap cell PTC may be arranged in the X- and Y-directions. According to example embodiments, the first to sixth standard cells SC1 to SC6 may configure a circuit such as an inverter circuit, a NAND circuit, or the like. In FIG. 3, only a left portion of the fourth standard cell SC4 may be illustrated.

The first power lines M1(VDD) and M1(VSS) may extend on boundaries of rows R0, R1, and R2 in which the first to sixth standard cells SC1 to SC6 and the power tap cell PTC are disposed. Back side power structures, as described above, may also extend on the boundaries. For example, the boundaries may be defined by the power rail tracks and/or the first power lines M1(VDD) and M1(VSS). That is, the boundaries in the Y-direction of the rows R0 to R10, the standard cells SC, and/or the power tap cells PTC may be defined by the power rail tracks and/or the first power lines M1(VDD) and M1(VSS). In some embodiments, each of the boundaries may correspond to a center in the Y-direction of one of the power rail tracks and/or one of the first power lines M1(VDD) and M1(VSS) thereon. Each of the boundaries may be a plane that extends in the X-direction and intersects the center in the Y-direction of one of the power rail tracks and/or one of the first power lines M1(VDD) and M1(VSS) thereon. Each of the boundaries may also be a plane that extends in the Z-direction and intersects the center in the Y-direction of one of the power rail tracks and/or one of the first power lines M1(VDD) and M1(VSS) thereon.

Each of the first to sixth standard cells SC1 to SC6 may include a pair of active patterns NS extending in the X-direction, active separation patterns SDB separating the active patterns NS from each other and extending in the Y-direction, gate patterns PC extending in the Y-direction, gate separation patterns CT separating the gate patterns PC, first contacts CA connected to the active patterns NS, second contacts CB connected to the gate patterns PC, lower vias VA connected to the first contacts CA, and first signal lines M1(S) connected to the lower vias VA. Each of the first to sixth standard cells SC1 to SC6 may further include a well region pattern such as an N well pattern. The power tap cell PTC may include the active separation patterns SDB, vertical power vias VPR, and the lower vias VA.

FIGS. 4A and 4B illustrate configurations disposed outside the third standard cell SC3 and the power tap cell PTC on a boundary of the third standard cell SC3 and the power tap cell PTC, together, for ease of understanding. According to the description method, the first power lines M1(VDD) and M1(VSS) may also be described as a configuration belonging to the first to sixth standard cells SC1 to SC6 and the power tap cell PTC.

Each of the active patterns NS may include, for example, an active region, which may be one or more active fin-shape respectively extending in the X-direction, and a plurality of channel layers on the active regions. In some embodiments, each of the active patterns NS may include, for example, a plurality of active fins respectively extending in the X-direction. The active patterns NS may be disposed in well regions having different conductivity types, and may be electrically connected to upper first contacts CA. In each of the first to sixth standard cells SC1 to SC6, a first contact CA connected to an active pattern NS, among the active patterns NS, may be connected to a high power transmission line M1(VDD) through a lower via VA, and a first contact CA connected to a different active pattern NS may be connected to a low power transmission line M1(VSS) through a lower via VA. In some embodiments, a width of each of the active patterns NS in the Y-direction in at least a portion of the first to sixth standard cells SC1 to SC6 may be different from those of a different portion thereof.

The gate patterns PC may cross the active patterns NS. The gate patterns PC may be divided in the Y-direction by the gate separation patterns CT between a pair of active patterns NS of each of the first to sixth standard cells SC1 to SC6. Although the gate patterns PC are illustrated as being separated between the first to sixth standard cells SC1 to SC6 in the Y-direction in FIG. 3, they are not limited thereto. In some embodiments, the gate patterns PC may continuously extend in the Y-direction, and the gate separation patterns CT may be further disposed between the first to sixth standard cells SC1 to SC6 in the Y-direction. The gate patterns PC may be connected to first signal lines M1(S) through the second contacts CB. In example embodiments, the gate patterns PC disposed on both ends (i.e., opposing ends) of the first to sixth standard cells SC1 to SC6 in the X-direction may be dummy gate lines that do not substantially constitute a circuit.

The first signal lines M1(S) may be interconnections disposed on the active patterns NS and gate patterns PC in each of the first to sixth standard cells SC1 to SC6, and may extend in the X-direction. The first signal lines M1(S) may be disposed on a level, equal to the first power lines M1(VDD) and M1(VSS), and may form a first interconnection line M1, together with the first power lines M1(VDD) and M1(VSS). For example, the first signal lines M1(S) may be at a height in the Z-direction that is equal to a height of the first power lines M1(VDD) and M1(VSS) in the Z-direction, relative to a lower surface of a substrate 101 (see FIGS. 5A to 5C). As used herein, the term "level" may mean a height in the Z-direction (i.e., vertical direction) from a lower surface of a substrate 101 to be described later (see FIGS. 5A to 5C). The first signal lines M1(S) may be signal transmission lines supplying a signal to a semiconductor device, and may be electrically connected to source/drain regions on the active patterns NS, and gate patterns PC.

The vertical power vias VPR may be disposed only in the power tap cell PTC, and may be disposed within a cell boundary of the power tap cell PTC, not to extend outside the cell boundary in the Y-direction. Specifically, the vertical power vias VPR may be disposed to contact an upper boundary and a lower boundary, respectively. For example, the vertical power vias VPR may be within a boundary of the power tap cell PTC, and the boundary may include the upper boundary and the lower boundary. The upper boundary and the lower boundary of the power tap cell PTC may be defined by a pair of the power rail tracks in the Y-direction and/or a pair of the first power lines M1(VDD) and M1(VSS) in the Y-direction that are on the pair of power rail tracks, respectively. For example, ones of the first power lines M1(VDD) and M1(VSS) may overlap respective ones of the vertical power vias VPR in the Z-direction. A length of each of the vertical power vias VPR in the X-direction may be equal to or smaller than a length of each of the vertical power vias VPR in the Y-direction. In this manner, the vertical power vias VPR may be disposed in the cell without being disposed across the cell boundary in the power tap cell PTC, such that a degree of freedom in placement of cells including the standard cells may increase around the power tap cell PTC.

Figure 5A:
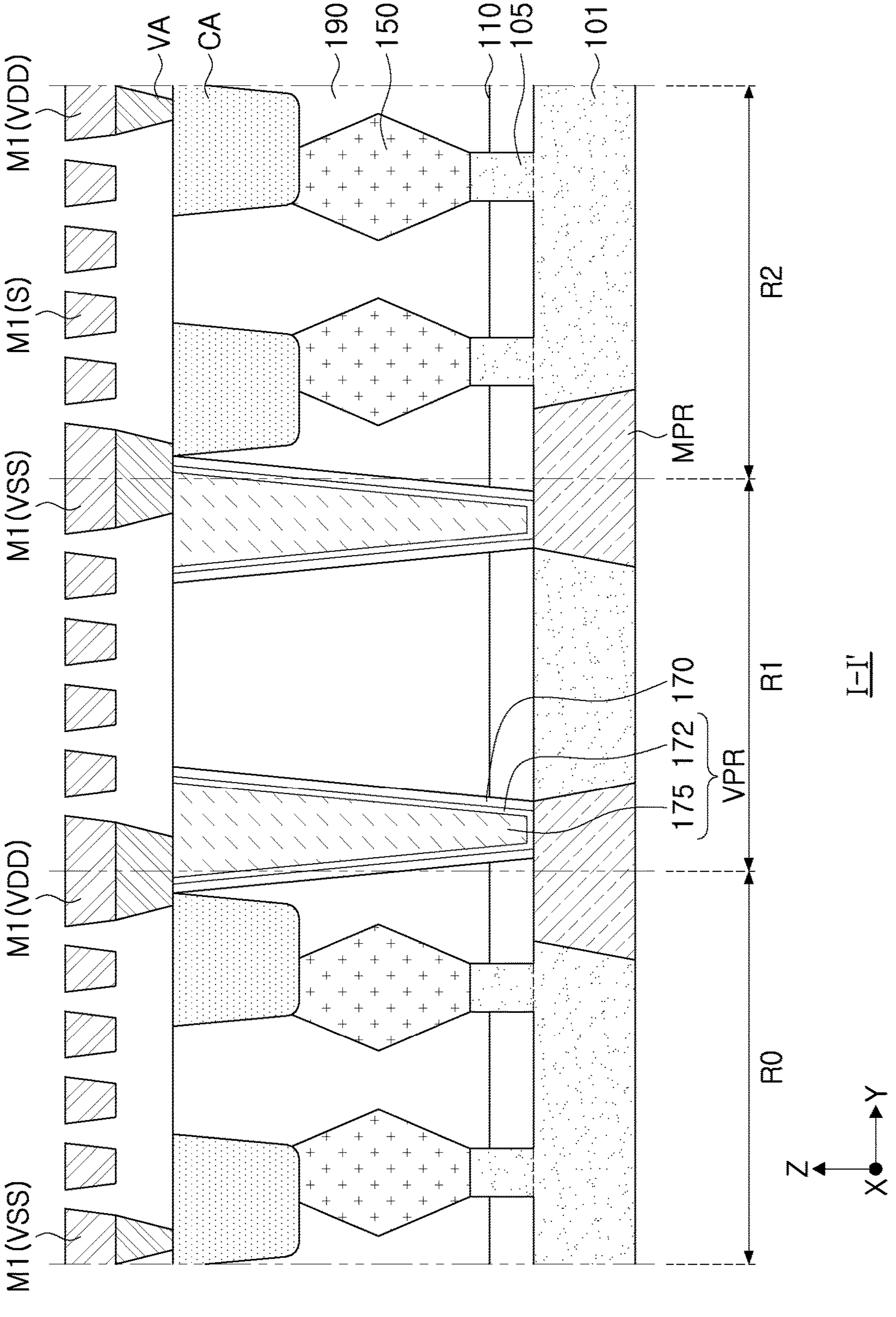
FIGS. 5A, 5B, and 5C are cross-sectional views illustrating a semiconductor device according to example embodiments.
Figure 5B:
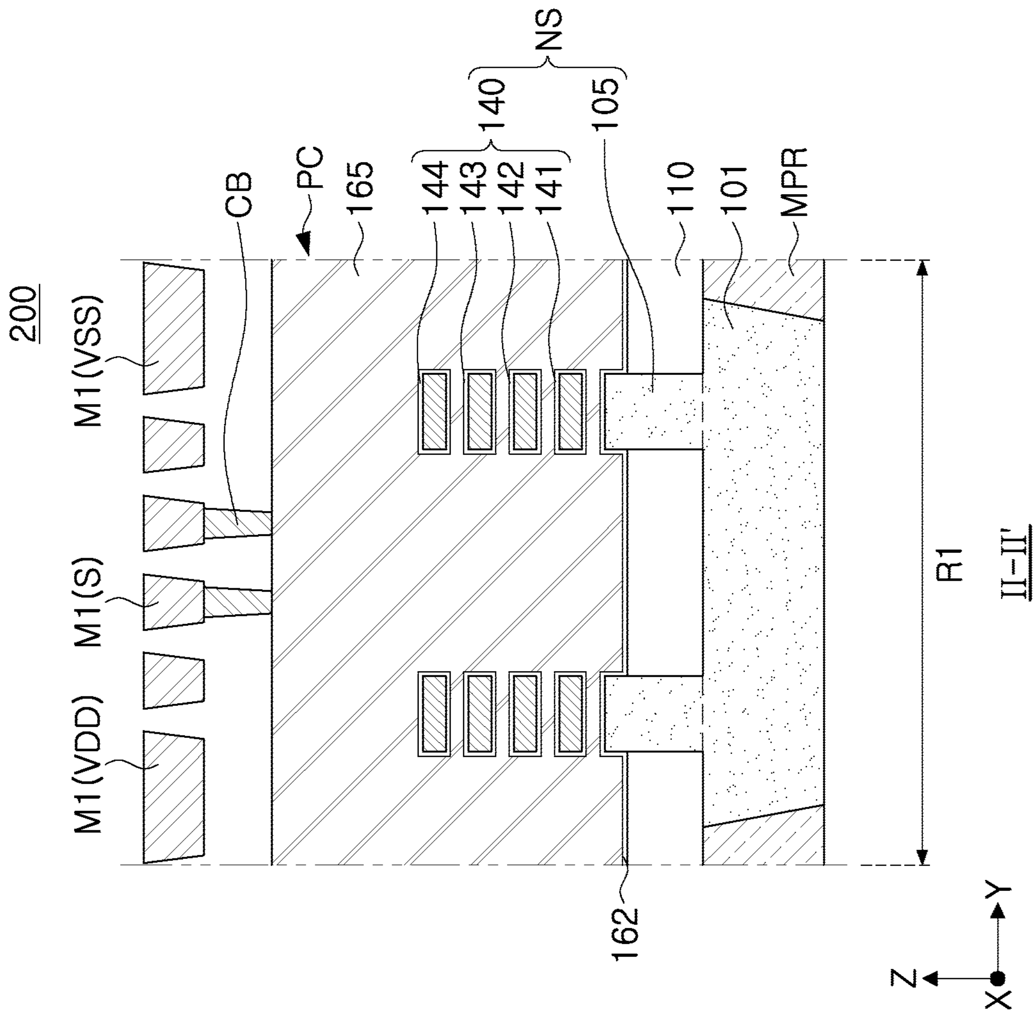
Figure 5C:
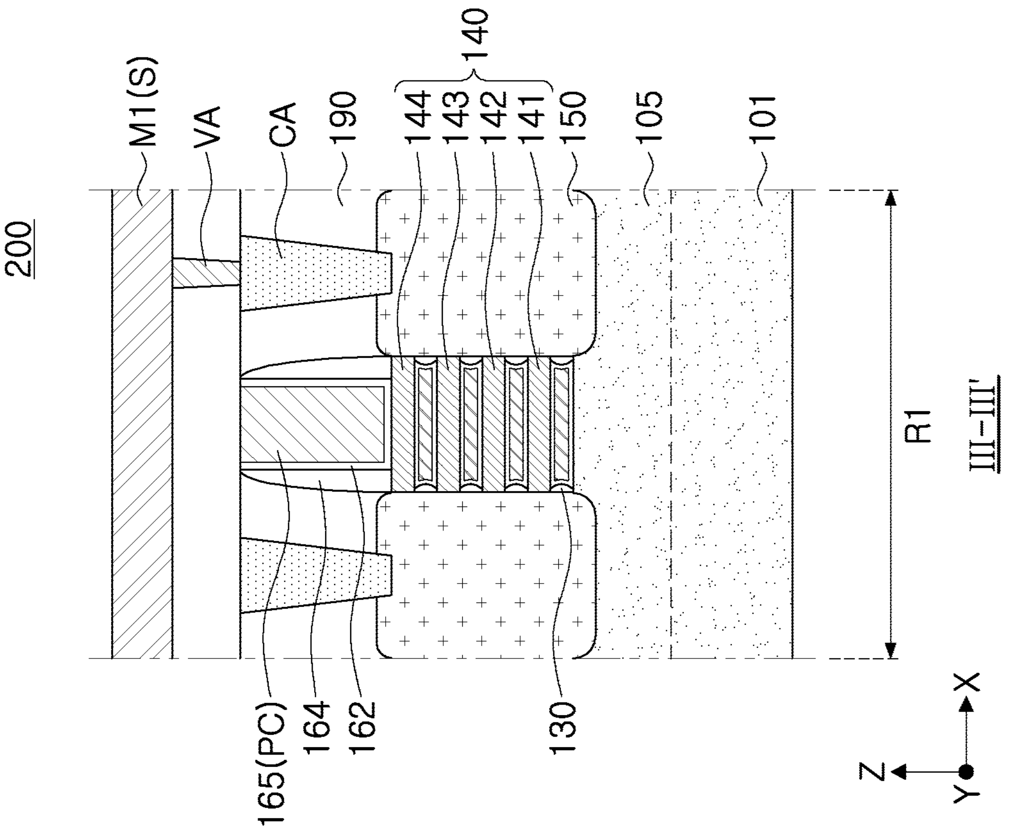

FIGS. 5A, 5B, and 5C are cross-sectional views illustrating a semiconductor device according to example embodiments. FIGS. 5A, 5B, and 5C illustrate cross-sections of the semiconductor device of FIG. 3, taken along lines I-I', II-II', and III-III', respectively. For convenience of description, only major components of the semiconductor device are illustrated in FIGS. 5A to 5C.

Referring to FIGS. 5A to 5C, the semiconductor device 200 may include a substrate 101 including active regions 105, channel structures 140 including first to fourth channel layers 141, 142, 143, and 144 disposed on the active regions 105 to be vertically spaced apart from each other, gate patterns PC extending to cross the active regions 105 and respectively including a gate electrode 165, source/drain regions 150 contacting the channel structures 140, first contacts CA connected to the source/drain regions 150 on the source/drain regions 150, lower vias VA on the first contacts CA, second contacts CB connected to the gate electrode 165, first interconnection lines M1(S), M1(VSS), and M1(VDD) on the lower vias VA and the second contacts CB, vertical power vias VPR electrically connected to at least a portion of the source/drain regions 150, and back side power structures MPR passing through the substrate 101 and connected to the vertical power vias VPR. The semiconductor device 200 may further include a device isolation layer 110, internal spacer layers 130, gate dielectric layers 162, gate spacer layers 164, an insulating liner 170, and an interlayer insulating layer 190.

The substrate 101 may have an upper surface extending in the X and Y-directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The substrate 101 may include the active regions 105 disposed in an upper portion thereof. However, depending on a description method, the active regions 105 may also be described as a separate configuration from the substrate 101. The active regions 105 may be arranged to extend in the first direction, for example, the X-direction. The active regions 105 may be defined by a predetermined depth from an upper surface in a portion of the substrate 101. The active regions 105 may be formed as a portion of the substrate 101 or may include an epitaxial layer grown from the substrate 101. Each of the active regions 105 may include active fins protruding in an upward direction. The active regions 105, together with the channel structures 140, may form an active structure in which a channel region of a transistor is formed. Each of the active regions 105 may include an impurity region. The impurity region may form at least a portion of a well region of the transistor.

The device isolation layer 110 may be located between adjacent active regions 105 in the Y-direction. Upper surfaces of the active regions 105 may be located on a level, higher than an upper surface of the device isolation layer 110. That is, a height in the Z-direction from a lower surface of the substrate 101 to upper surfaces of the active regions 105 may be higher than a height in the Z-direction from the lower surface of the substrate 101 to an upper surface of the device isolation layer 110. The active regions 105 may be partially recessed on both sides (i.e., opposing sides) of the gate patterns PC, and the source/drain regions 150 may be respectively disposed on the recessed regions (e.g., see FIG. 5C).

The device isolation layer 110 may fill between the active regions 105, and may define the active regions 105 on the substrate 101. The device isolation layer 110 may be formed by, for example, a shallow trench isolation (STI) process. The device isolation layer 110 may expose an upper surface of the active region 105 or partially expose an upper portion of the active region 105. The device isolation layer 110 may be formed of an insulating material. The device isolation layer 110 may include, for example, an oxide, a nitride, or a combination thereof.

The gate patterns PC may be disposed on the active regions 105 to cross the active regions 105, and extend in the second direction, for example, the Y-direction. The gate patterns PC may include a gate electrode 165. Channel regions of transistors may be formed in the active regions 105 and the channel structure 140 crossing the gate electrode 165.

The gate electrode 165 may include a conductive material, and may include, for example, a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon. According to some embodiments, the gate electrode 165 may be provided as a multilayer structure.

The gate dielectric layers 162 may be disposed between the active region 105 and the gate electrode 165 and between the channel structure 140 and the gate electrode 165, and may be arranged to cover at least a portion of surfaces of the gate electrode 165. For example, the gate dielectric layers 162 may be disposed to surround all surfaces except for an uppermost surface of the gate electrode 165. The gate dielectric layers 162 may extend between the gate electrode 165 and the gate spacer layers 164, but is not limited thereto. The gate dielectric layer 162 may include an oxide, a nitride, or a high-κ material. The high-κ material may mean a dielectric material having a higher dielectric constant than a silicon oxide ($SiO_2$). The high-κ material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). According to some embodiments, the gate dielectric layer 162 may be provided as a multilayer structure.

The gate spacer layers 164 may be disposed on both side surfaces (i.e., opposing side surfaces) of the gate electrode 165 on the channel structure 140. The gate spacer layers 164 may insulate the source/drain regions 150 and the gate electrodes 165. Depending on embodiments, shapes of upper ends of the gate spacer layers 164 may be variously changed, and the gate spacer layers 164 may be provided as a multilayer structure. The gate spacer layers 164 may include at least one of an oxide, a nitride, or an oxynitride, and may be provided as, for example, a low-κ film.

The channel structures 140 may be disposed on the active regions 105 in regions in which the active regions 105 intersect the gate patterns PC. Each of the channel structures 140 may include the first to fourth channel layers 141, 142, 143, and 144 that may be two or more channel layers spaced apart from each other in the Z-direction. The channel structures 140 may be connected to the source/drain regions 150. Each of the channel structures 140 may have a width, equal to or smaller than a width of the active region 105 in the Y-direction, and may have a width, equal to or similar to a width of each of the gate patterns PC in the X-direction. In a cross-section in the Y-direction, a lower channel layer may have a width, equal to or wider than a width of an upper channel layer, among the first to fourth channel layers 141, 142, 143, and 144.

The channel structures 140 may be formed of a semiconductor material, and may include, for example, at least one of silicon (Si), silicon germanium (SiGe), or germanium (Ge). The channel structures 140 may be formed of, for example, the same material as the active regions 105. The number and shapes of channel layers constituting one channel structure 140 may be variously changed in embodiments.

In the semiconductor device 200, the gate electrode 165 may be disposed between the active region 105 and the channel structures 140, between the first to fourth channel layers 141, 142, 143, and 144 of the channel structures 140, and on the channel structures 140. Therefore, the semiconductor device 200 may include a multi-bridge-channel FET (MBCFET™) transistor, which may be a gate-all-around type field effect transistor. In some embodiments, the active patterns NS may not include the channel structures 140, and may have, for example, a FinFET structure.

The source/drain regions 150 may be disposed to contact the channel structures 140 on both sides (i.e., opposing sides) of the gate patterns PC. The source/drain regions 150 may be disposed in regions in which an upper portion of the active region 105 is partially recessed. As illustrated in FIG. 5A, at least a portion of the source/drain regions 150 may be connected to the back side power structures MPR through the first contacts CA, the lower vias VA, and the vertical power vias VPR, and may receive power from the back side power structures MPR.

Upper surfaces of the source/drain regions 150 may be located at the same or similar level (e.g., in the Z-direction) as lower surfaces of the gate patterns PC on the channel structures 140, but levels of the upper surfaces of the source/drain regions 150 may be variously changed in embodiments. The source/drain regions 150 may have a polygonal shape as illustrated in FIG. 5A, an elliptical shape, or the like, in a cross-section in the Y-direction, but is not limited to the illustrated shape. The source/drain regions 150 may include a semiconductor material, for example, silicon (Si) and/or germanium (Ge), and may further include impurities.

The internal spacer layers 130 may be disposed parallel to the gate electrode 165 between the first to fourth channel layers 141, 142, 143, and 144 in the Z-direction. The gate electrode 165 may be stably spaced apart and electrically separated from the source/drain regions 150 by the internal spacer layers 130. The internal spacer layers 130 may have a shape in which a side surface facing the gate electrode 165 may be convexly rounded toward the gate electrode 165 in an inward direction, but is not limited thereto. The internal spacer layers 130 may include at least one of an oxide, a nitride, or an oxynitride, and may be provided as, for example, low-κ films. In some embodiments, the internal spacer layers 130 may be omitted.

The first contacts CA may be disposed on the source/drain regions 150. The first contacts CA may be on opposing sides of the gate pattern PC, respectively (e.g., see FIG. 5C). The first contacts CA may pass through the interlayer insulating layer 190, and may be connected to the source/drain regions 150. The first contacts CA may have side surfaces inclined so that the first contacts CA decrease in width toward the substrate 101 due to an aspect ratio, but are not limited thereto. The first contacts CA may partially recess the source/drain regions 150, and may be arranged to partially contact surfaces including upper surfaces of the source/drain regions 150.

The lower vias VA may vertically connect the first contacts CA and the first interconnection lines M1(S), M1(VSS), and M1(VDD). As illustrated in FIG. 5A, a portion of the lower vias VA may have a configuration in which a first region on the vertical power vias VPR and a second region on the first contacts CA are horizontally connected to each other, and, for example, may be simultaneously connected to the first contacts CA and the vertical power vias VPR.

The second contacts CB may be disposed on the gate electrodes 165 to vertically connect the gate electrodes 165 and first signal lines M1(S). In some embodiments, the lower vias VA may be further disposed on the second contacts CB.

The first contacts CA, the second contacts CB, and the lower vias VA may include a conductive material, for example, a metal material such as tungsten (W), aluminum (Al), copper (Cu), or the like, or a semiconductor material such as doped polysilicon, respectively. In some embodiments, at least one of the first contacts CA, the second contacts CB, or the lower vias VA may include a barrier metal layer disposed along an outer surface. In some embodiments, the first contacts CA may further include a metal-semiconductor layer such as a silicide layer disposed on an interface contacting the source/drain regions 150.

The first interconnection lines M1(S), M1(VSS), and M1(VDD) may be disposed on the lower vias VA and the second contacts CB. The first interconnection lines M1(S), M1(VSS), and M1(VDD) may include first signal lines M1(S), first high power lines M1(VDD), and first low power lines M1(VSS). Vias and interconnection lines may be further disposed on the first interconnection lines M1(S), M1(VSS), and M1(VDD).

The first interconnection lines M1(S), M1(VSS), and M1(VDD) may include a conductive material, for example, a metal material such as tungsten (W), aluminum (Al), copper (Cu), or the like. In some embodiments, the first interconnection lines M1(S), M1(VSS), and M1(VDD) and the lower vias VA may be formed as a single damascene structure, respectively, but are not limited thereto.

The vertical power vias VPR may extend in the Z-direction through the interlayer insulating layer 190 and the device isolation layer 110. The vertical power vias VPR may have side surfaces inclined so that the vertical power vias VPR decrease in width toward the substrate 101. The vertical power vias VPR may be disposed to electrically connect at least a portion of the first contacts CA to the back side power structures MPR. The vertical power vias VPR may be connected to the lower vias VA through an upper end or an upper surface, and may be connected to the back side power structures MPR through a lower end or a lower surface. In FIG. 5A, the vertical power vias VPR may be electrically connected to the first contacts CA through the lower vias VA, but are not limited thereto. In some embodiments, the vertical power vias VPR may be directly connected through side surfaces of the first contacts CA.

The vertical power via VPR may be disposed such that a vertical central axis thereof is offset from a vertical central axis of the back side power structure MPR. That is, a center of the back side power structure MPR in the Y-direction may be offset in the Z-direction from (e.g., may not be aligned in the Z-direction with) a center of the vertical power via VPR in the Y-direction. This may be because the vertical power via VPR has a layout disposed within the power tap cell PTC. The vertical power vias VPR and the connected lower vias VA may also be disposed such that vertical central axes thereof are offset from each other. The vertical central axes of the back side power structure MPR and the lower via VA may coincide with each other.

Each of the vertical power vias VPR may include a barrier layer 172 covering a bottom surface and an inner side wall of a via hole in which the vertical power via VPR is disposed, and a via conductive layer 175 filling the via hole on the barrier layer 172. The barrier layer 172 may include, for example, a metal nitride such as titanium nitride (TiN), tantalum nitride (TaN), or tungsten nitride (WN). The via conductive layer 175 may include a conductive material, for example, a metal material such as molybdenum (Mo), aluminum (Al), tungsten (W), or the like.

The insulating liner 170 may be disposed to cover side surfaces of the vertical power vias VPR. The insulating liner 170 may include an insulating material such as at least one of an oxide, a nitride, or an oxynitride. In some embodiments, the insulating liner 170 may be omitted.

The back side power structures MPR may pass through the substrate 101, and may be connected to lower surfaces of the vertical power vias VPR. The back side power structures MPR may be connected to separate vias and power lines, disposed below a lower surface of the substrate 101. The back side power structures MPR may be on a lower surface of the substrate 101. The back side power structures MPR may have a linear shape extending in the X-direction, but are not limited thereto. In some embodiments, the back side power structures MPR may have a tetragonal shape, an elliptical shape, or a circular shape in a plan view. The back side power structures MPR may have side surfaces inclined so that the back side power structures MPR decrease in width toward the upper surface of the substrate 101 or the upper surfaces of the active regions 105. In some embodiments, an insulating liner layer may be further disposed between the back side power structures MPR and the substrate 101.

The back side power structures MPR may include a conductive material, for example, a metal material such as molybdenum (Mo), aluminum (Al), tungsten (W), or the like. In some embodiments, the back side power structures MPR may further include a barrier layer covering upper and side surfaces.

The interlayer insulating layer 190 may be disposed to cover the source/drain regions 150 and the gate patterns PC. The interlayer insulating layer 190 may include at least one of an oxide, a nitride, or an oxynitride, and may include, for example, a low-κ material. According to some embodiments, the interlayer insulating layer 190 may include a plurality of insulating layers.

Figure 6:
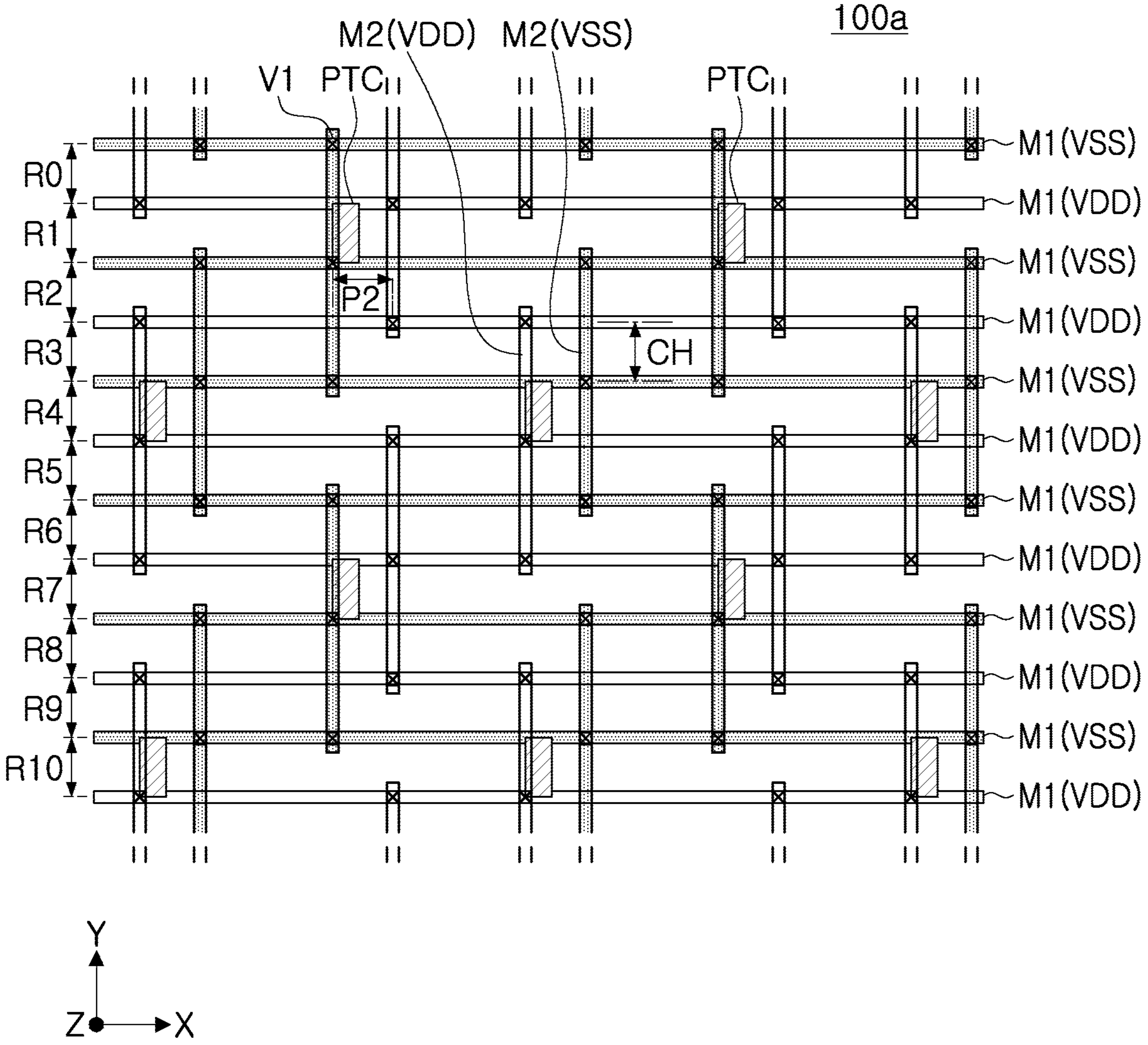
FIG. 6 is a schematic layout diagram of a semiconductor device according to example embodiments.

FIG. 6 is a schematic layout diagram of a semiconductor device according to example embodiments.

Referring to FIG. 6, a semiconductor device 100*a* may include first power lines M1(VDD) and M1(VSS), power tap cells PTC, second power lines M2(VDD) and M2(VSS), and upper vias V1. The description above with reference to FIG. 2 may be equally applied to the first power lines M1(VDD) and M1(VSS) and the power tap cells PTC of FIG. 6.

The upper vias V1 may connect the first power lines M1(VDD) and M1(VSS) and the second power lines M2(VDD) and M2(VSS).

Two second power lines M2(VDD) and M2(VSS) may be disposed adjacent to each other in each of the power tap cells PTC. The second power lines M2(VDD) and M2(VSS) may include second high power lines M2(VDD) electrically connected to first high power lines M1(VDD) and supplying a first voltage, and second low power lines M2(VSS) electrically connected to first low power lines M1(VSS) and supplying a second voltage, lower than the first voltage. One second high power line M2(VDD) and one second low power line M2(VSS) may be disposed in a pair, to be adjacent to each of the power tap cells PTC. The second high power line M2(VDD) and the second low power line M2(VSS) adjacent to each of the power tap cells PTC may be arranged to have an asymmetric shape in the X-direction around the power tap cell PTC. That is, a pair of the second high and low power lines M2(VDD) and M2(VSS) may be adjacent to one of the power tap cells PTC and may be offset from each other in the X-direction (e.g., may not be aligned with each other in the X-direction). The second high power lines M2(VDD) may be spaced apart from each other in the Y-direction and the second low power lines M2(VSS) may be spaced apart from each other in the Y-direction.

In a power tap cell PTC, one of the second high power line M2(VDD) or the second low power line M2(VSS), disposed adjacent to the power tap cell PTC, may be disposed to overlap in the Z-direction one end portion of the power tap cell PTC in the X-direction and the other one thereof may be spaced apart from the power tap cell PTC in the X-direction, in a plan view. For example, one of the second high power line M2(VDD) or the second low power line M2(VSS) may overlap a standard cell. For example, a first portion of the second power lines M2(VDD) and M2(VSS) may extend onto the power tap cells PTC, and a second portion of the second power lines M2(VDD) and M2(VSS) that is different from the first portion may extend onto the standard cells. The standard cell may be a standard cell contacting a power tap cell PTC, and in this case, IR drop may be minimized, but is not limited thereto.

A pitch P2 of the second high power line M2(VDD) and the second low power line M2(VSS), disposed adjacent to the power tap cell PTC, may be greater than a width of the power tap cell PTC, and may be, for example, twice the width of the power tap cell PTC. Relative arrangement of the second power lines M2(VDD) and M2(VSS) and the power tap cells PTC and the pitch P2 of the second power lines M2(VDD) and M2(VSS) may be varied in various manners. For example, in some embodiments, both the second high power line M2(VDD) and the second low power line M2(VSS) may be spaced apart from the power tap cell PTC in the X-direction.

Specifically, each of the second high power lines M2(VDD) may be connected to a BSPDN such as a back side power structure MPR (see FIG. 5A) by the power tap cell PTC, and may be connected to the first high power line M1(VDD) that overlaps the power tap cell PTC in the Z-direction by, for example, the upper via V1. The second high power line M2(VDD) may be further connected to two adjacent first high power lines M1(VDD) in the Y-direction by, for example, the upper vias V1. Each of the second low power lines M2(VSS) may be arranged in the same manner. In other words, the second power lines M2(VDD) and M2(VSS) may electrically connect ones of the first power lines M1(VDD) and M1(VSS) that are on the power tap cells PTC to ones of the first power lines M1(VDD) and M1(VSS) that are spaced apart from the power tap cells PTC in the Y-direction. In some embodiments, the second high power line M2(VDD) and the second low power line M2(VSS) may be further connected to one first high power line M1(VDD) and one first low power line M1(VSS), adjacent thereto, respectively.

A length of each of the second power lines M2(VDD) and M2(VSS) in the Y-direction may be greater than two times and less than five times a unit cell height CH. For example, in some embodiments, the length of each of the second power lines M2(VDD) and M2(VSS) may be similar to each other and may be greater than 4 times the unit cell height CH.

The second power lines M2(VDD) and M2(VSS) may be arranged in this manner, to transmit an electrical signal to the first power lines M1(VDD) and M1(VSS) that are not connected to the power tap cells PTC. In the semiconductor device 100*a*, IR drop may be determined by resistance of a route extending from the power tap cell PTC to an upper via V1 and the second power lines M2(VDD) and M2(VSS). For example, in the first low power line M1(VSS) disposed between a fifth row R5 and a sixth row R6, IR drop at a point in which the IR drop is the largest may be determined by resistance of the power tap cell PTC on a fourth row R4, resistance of the first low power line M1(VSS) between the power tap cell PTC and the upper via V1, resistance of the upper via V1, resistance of the second low power line M2(VSS) having a length corresponding to twice the unit cell height CH, resistance of the upper via V1, and resistance of the first low power line M1(VSS) having a length corresponding to half of a distance in the X-direction between adjacent power tap cells PTC in a diagonal direction.

Figure 7A:
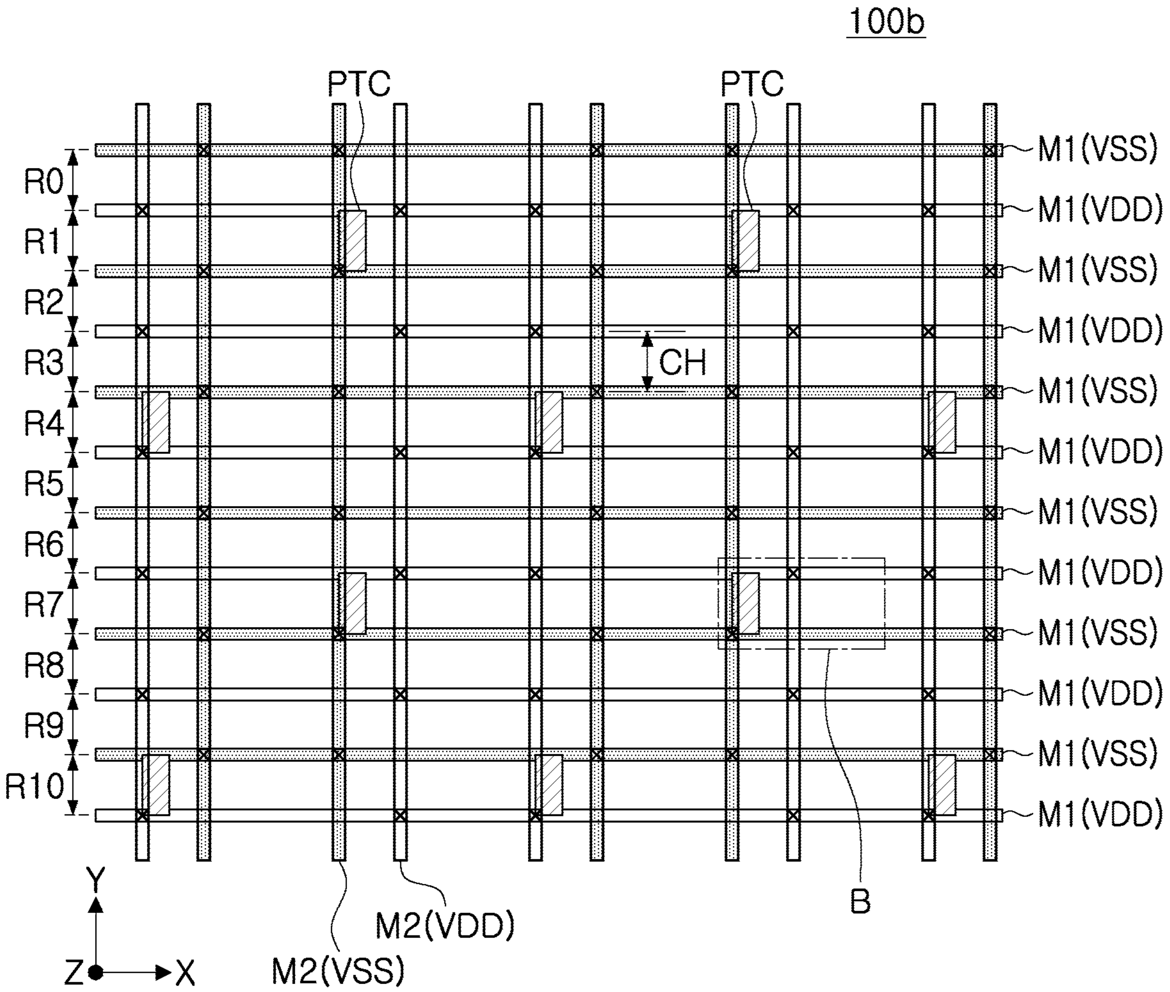
FIGS. 7A and 7B are schematic layout diagrams of a semiconductor device according to example embodiments.
Figure 7B:
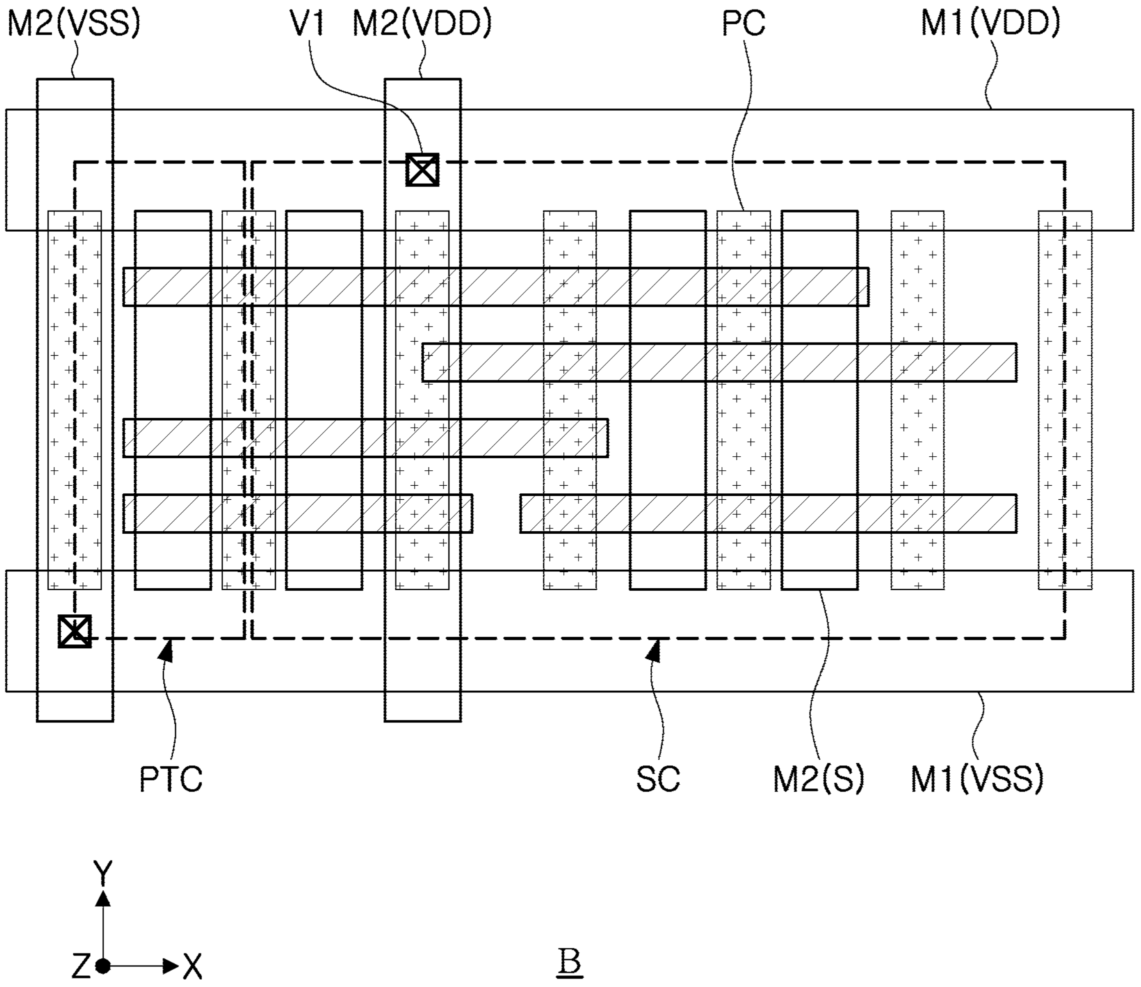

FIGS. 7A and 7B are schematic layout diagrams of a semiconductor device according to example embodiments. FIG. 7B illustrates a layout of an example embodiment for portion 'B' of FIG. 7A.

Referring to FIGS. 7A and 7B, in a semiconductor device 100_b_, second power lines M2(VDD) and M2(VSS) may be disposed to continuously extend in the Y-direction. That is, second high power lines M2(VDD) may not be spaced apart from each other in the Y-direction, and second low power lines M2(VSS) may not be spaced apart from each other in the Y-direction. The second power lines M2(VDD) and M2(VSS) may have a mesh shape with first power lines M1(VDD) and M1(VSS) in a plan view. For example, the second power lines M2(VDD) and M2(VSS) may be aligned with each other in the X-direction. The second power lines M2(VDD) and M2(VSS) may be disposed on gate patterns PC of standard cells SC and power tap cells PTC, respectively, or may be disposed on first contacts CA (see FIG. 3).

As illustrated in FIG. 7B, for example, when the second power lines M2(VDD) and M2(VSS) are respectively disposed on the gate patterns PC, second signal lines M2(S) disposed on a level, equal to the second power lines M2(VDD) and M2(VSS), in the standard cells SC and the power tap cells PTC, may not be disposed on at least a portion of the gate patterns PC, and may be designed to be offset from the gate patterns PC. For example, the second signal lines M2(S) may be offset from the gate patterns PC in the Z-direction (e.g., may not be aligned with the gate patterns PC in the Z-direction). For example, in FIG. 7B, a region indicated as the standard cell SC may be a region in which one or a plurality of standard cells are disposed. The second signal lines M2(S) may be at a height in the Z-direction that is equal to a height of the second power lines M2(VDD) and M2(VSS) in the Z-direction, relative to a lower surface of the substrate 101 (see FIGS. 5A to 5C). A second signal line M2(S) may not be disposed on and adjacent to first, second, and fourth gate patterns PC from the left, except for the gate pattern PC on a left end portion of the standard cell SC. Therefore, the second power lines M2(VDD) and M2(VSS) constituting a PDN may be easily arranged, as illustrated in FIG. 7A.

Figure 8:
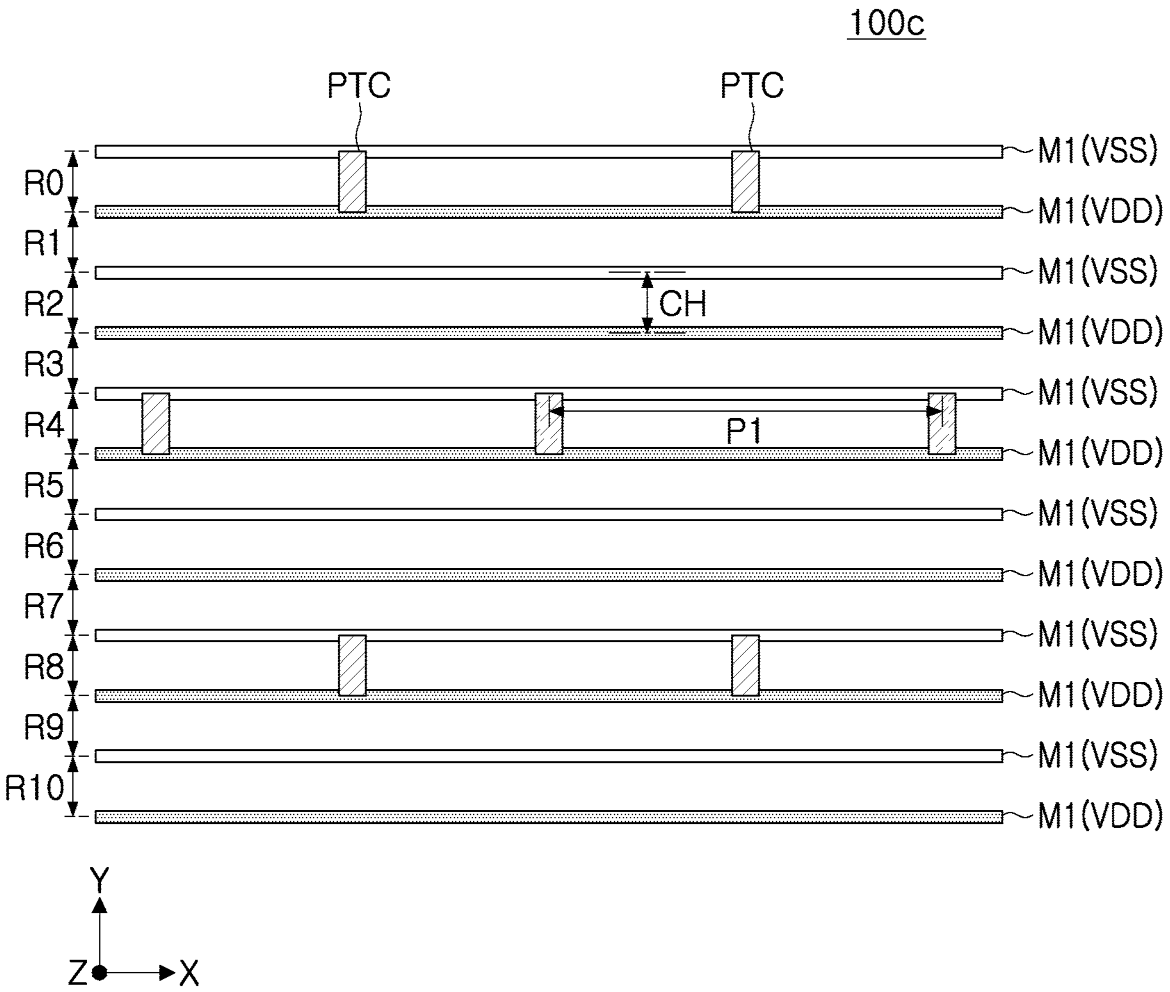
FIG. 8 is a schematic layout diagram of a semiconductor device according to example embodiments.

FIG. 8 is a schematic layout diagram of a semiconductor device according to example embodiments.

Referring to FIG. 8, in a semiconductor device 100_c_, power tap cells PTC may be disposed in only ¼ of rows R0 to R10. The power tap cells PTC may be arranged in a first group of rows (R0, R4, and R8) and may not be arranged in a second group of rows (R1, R2, R3, R5, R6, R7, R9, and R10). The power tap cells PTC may be arranged every four rows in the Y-direction, and may be arranged to be staggered with each other or in a zigzag pattern.

Standard cells may be disposed in regions in which the power tap cells PTC are not disposed in the rows R0 to R10. Since the power tap cells PTC may not be disposed in the second group of rows (R1, R2, R3, R5, R6, R7, R9, and R10), standard cells having various sizes may be disposed around the power tap cells PTC. For example, in some of the second group of rows (R1, R2, and R3) adjacent in the Y-direction, a degree of freedom in cell arrangement may be secured in a region corresponding to three times a unit cell height CH. When a pitch P1 of the power tap cells PTC is, for example, 40 CPP, a degree of freedom in cell arrangement may be secured in a region having a length corresponding to 40 CPP in the first group of rows (R0, R4, and R8).

Arrangement of power tap cells and arrangement of second power lines connected to the power tap cells may be optimized to provide a semiconductor device having an improved degree of integration and easy to manufacture due to an improved degree of design freedom.

Various advantages and effects of the present inventive concepts are not limited to the above, and will be more easily understood in the process of describing specific embodiments of the present inventive concepts.

While example embodiments have been illustrated and described above, it will be apparent to those skilled in the art that modifications and variations could be made without departing from the scope of the present inventive concepts as defined by the appended claims.

The invention claimed is:

1. A semiconductor device comprising:

first power lines that extend on a substrate in a first direction, are spaced apart from each other in a second direction intersecting the first direction, and are on power rail tracks;

back side power structures on a lower surface of the substrate;

standard cells arranged in the first and second directions, wherein each of the standard cells comprises an active pattern that extends in the first direction, a gate pattern that intersects the active pattern and extends in the second direction, and contacts on opposing sides of the gate pattern, respectively;

power tap cells between at least some of the standard cells, wherein each of the power tap cells comprises vertical power vias that are electrically connected to ones of the first power lines and ones of the back side power structures, respectively; and second power lines that extend in the second direction on the first power lines, wherein at least one of the second power lines electrically connects at least one of the first power lines that is on at least one of the power tap cells to one or more of the first power lines that are spaced apart from the at least one of the power tap cells in the second direction, wherein the power rail tracks define rows in the second direction, wherein the power tap cells are arranged in every three or more of the rows and are staggered with each other in the second direction, and wherein ones of the first power lines overlap respective ones of the vertical power vias.

2. The semiconductor device of claim 1, wherein, in the second direction, a length of each of the second power lines is less than five times a length of each of the standard cells.

3. The semiconductor device of claim 2, wherein, in the second direction, the length of each of the second power lines is greater than four times the length of each of the standard cells.

4. The semiconductor device of claim 1, wherein a center of each of the back side power structures in the second direction is offset in a vertical direction from a center of each of the vertical power vias in the second direction, respectively.

5. The semiconductor device of claim 1, wherein the vertical power vias are within a boundary of respective ones of the power tap cells.

6. The semiconductor device of claim 1, wherein each of the standard cells further comprises first lower vias that are electrically connected to the contacts on the contacts, wherein each of the power tap cells further comprises second lower vias that are electrically connected to the vertical power vias on the vertical power vias and are horizontally electrically connected to the first lower vias of adjacent ones of the standard cells, and wherein a center of each of the second lower vias in the second direction is offset in a vertical direction from a center of each of the vertical power vias in the second direction, respectively.

7. The semiconductor device of claim 1, wherein the first power lines and the back side power structures extend on boundaries of the rows.

8. The semiconductor device of claim 7, wherein the first power lines overlap the back side power structures in a vertical direction.

9. The semiconductor device of claim 7, wherein, in the second direction, each of the first power lines has a first width, and each of the back side power structures has a second width greater than the first width.

10. The semiconductor device of claim 1, wherein each of the power tap cells is in contact with at least one of the standard cells in the second direction.

11. The semiconductor device of claim 1, wherein a first portion of the second power lines extends onto the power tap cells, and a second portion of the second power lines that is different from the first portion extends onto the standard cells.

12. The semiconductor device of claim 11, wherein each of the standard cells further comprises:

first signal lines at a height in a vertical direction that is equal to a height of the first power lines in the vertical direction, relative to the lower surface of the substrate; and second signal lines at a height in the vertical direction that is equal to a height of the second power lines in the vertical direction, relative to the lower surface of the substrate, and wherein the second signal lines are offset from the gate pattern in the vertical direction.

13. The semiconductor device of claim 1, wherein the rows comprise first to fourth rows in the second direction, wherein the standard cells are arranged in the first to fourth rows, wherein the power tap cells comprise a first power tap cell in the first row and a second power tap cell in the fourth row, and wherein the first power tap cell and the second power tap cell are offset from each other in the second direction.

14. The semiconductor device of claim 1, wherein the active pattern comprises:

an active region that is a portion of the substrate; and a plurality of channel layers spaced apart from each other and on the active region.

15. A semiconductor device comprising:

first power lines that extend on a substrate in a first direction and are spaced apart from each other in a second direction intersecting the first direction;

back side power structures on a lower surface of the substrate;

standard cells arranged in the first and second directions, wherein each of the standard cells comprises an active pattern that extends in the first direction, a gate pattern that intersects the active pattern and extends in the second direction, and contacts on opposing sides of the gate pattern, respectively;

power tap cells between at least some of the standard cells, wherein each of the power tap cells comprises vertical power vias that are electrically connected to ones of the first power lines and ones of the back side power structures, respectively; and second power lines that extend in the second direction on the first power lines and electrically connect at least some of the first power lines to each other, wherein a first portion of the second power lines extends onto the power tap cells and a second portion of the second power lines that is different from the first portion extends onto the standard cells, and wherein the power tap cells are arranged in every three or more rows of the standard cells in the second direction and are arranged in a zigzag pattern in the second direction.

16. The semiconductor device of claim 15, wherein the vertical power vias are within a boundary of respective ones of the power tap cells.

17. The semiconductor device of claim 15, wherein a pair of the second power lines are adjacent to one of the power tap cells and are offset from each other in the first direction.

18. The semiconductor device of claim 15, wherein the second power lines are aligned to form a mesh shape with the first power lines in a plan view.

19. A semiconductor device comprising:

first power lines that extend on a substrate in a first direction and are spaced apart from each other in a second direction intersecting the first direction;

back side power structures on a lower surface of the substrate;

standard cells arranged in the first and second directions, wherein each of the standard cells comprises an active pattern that extends in the first direction, a gate pattern that intersects the active pattern and extends in the second direction, and contacts on opposing sides of the gate pattern, respectively; and power tap cells between at least some of the standard cells, wherein each of the power tap cells comprises vertical power vias that are electrically connected to ones of the first power lines and ones of the back side power structures, respectively, wherein the standard cells are arranged in first to seventh rows in the second direction, wherein the power tap cells comprise first power tap cells in the first row, second power tap cells in the fourth row, and third power tap cells in the seventh row, and wherein the first power tap cells and the second power tap cells are offset from each other in the second direction, and the first power tap cells and the third power tap cells are aligned in the second direction.

20. The semiconductor device of claim 19, wherein the second row and the third row are free of the power tap cells.

* * * * *